United States Patent [19]

Darmouni

[11] 4,437,075

[45] Mar. 13, 1984

[54] SELF-CORRECTED ELECTRIC FILTERS

[75] Inventor: Corinne Darmouni, Paris, France

[73] Assignee: Thomson-CSF, Paris, France

[21] Appl. No.: 337,751

[22] Filed: Jan. 7, 1982

[30] Foreign Application Priority Data

Jan. 23, 1981 [FR] France .............................. 81 01294

[51] Int. Cl.³ ...................... H03H 7/03; H03H 7/075
[52] U.S. Cl. ..................................... 333/167; 333/32;
333/138; 333/168
[58] Field of Search .......... 333/32, 167, 168, 174–176,
333/202–212, 245, 248, 138–140, 177–180

[56] References Cited

U.S. PATENT DOCUMENTS 3,060,389 10/1962 Kahn ................................ 333/169 X
3,132,313 5/1964 Alford ............................. 333/168 X

OTHER PUBLICATIONS

Saito—"Coupled Resonant Networks with Attenuation Poles", Trans Inst. Electron Commun. Eng. Japan A.B.C. vol. 53, No. 4 (Apr. 1970); pp. 1–2.
Hägele—"Mikrowellenfilter mit Umwegkopplungen zur Erzeugung von Dampfungspolen", Frequenz 24 (1970) 11; pp. 340–341.
Atia et al.—"Narrow-Bandpass Waveguide Filters", IEEE Transactions on Microwave Theory and Techniques, vol. MTT-20, No. 4, Apr. 1972; pp. 258–265.

Primary Examiner—Marvin L. Nussbaum
Attorney, Agent, or Firm—Cushman, Darby & Cushman

[57] ABSTRACT

A self-corrected electric filter with localized constant elements having two inputs, two outputs, input and output matching means, a group of an even number of filter elements in cascade for filtering the wide band signal, group delay time correction means comprising adjacent secondary couplings connected between at least two successive filter elements and secondary non-adjacent couplings connected between at least two non-adjacent filter elements.

3 Claims, 6 Drawing Figures

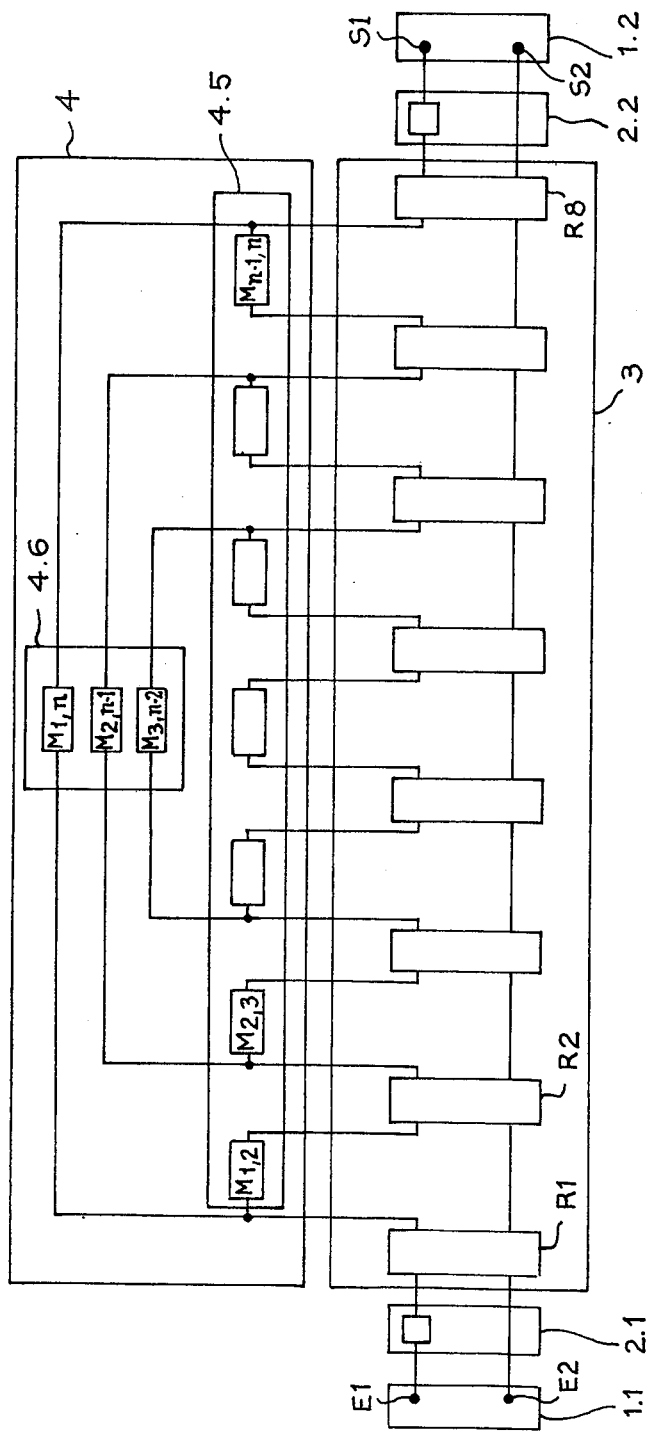
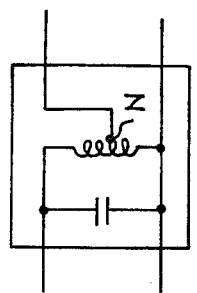
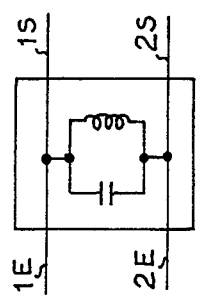
Fig. 1
Fig. 5
Fig. 4

4,437,075

SELF-CORRECTED ELECTRIC FILTERS

BACKGROUND OF THE INVENTION

The present invention relates to self-corrected electric filters and more specifically to self-corrected electric filters with localized constant elements of the band pass type making it possible to filter analog or digital signals in a wide frequency band and making it possible to correct the group or envelope delay time distortion in this frequency band.

Such filters are particularly useful in radio receivers. In a particular construction of such receivers, conventional electric filters are used, which do not correct the distortion of the group delay. However, this is often an important disadvantage for the transmission of the signal. The passage time at the different frequencies of the pass band is not constant. Thus, the group delay increases from a low value for the centre frequencies of the pass band up to a high value for its limit frequencies. The group delay correction function is realised by two correcting networks which are very frequently formed by one or more cells comprising active elements. When there are several cells in the correcting network, each cell is insulated from the adjacent cells by a transistor. These correcting networks are arranged in cascade form following the filter. In the case of a radio receiver, it is conventional practice to use two cells in cascade for phase correction purposes. The centre frequencies of the two cells are located on either side of the centre frequency of the band pass filter which it is sought to compensate.

In certain ultra-high frequency applications, narrow pass band microwave filters are used. The group delay correction function is realised by using multiple-coupled cavities. The synthesis of these filters have been described in the technical literature, as is shown by the following publications: J. D. RHODES "General filter with linear phase by direct coupling cavity" i.e. IEEE Transactions MTT, Volume MTT 18, No. 6, June 1970, pp. 308–313; A. E. Atia et al "Narrow-band pass waveguide filters", IEEE Transactions MTT, Volume MTT 18, No. 4 April 1972, pp. 258–264; and A. E. Atia et al "Synthesis of narrow-band multiple-coupled cavity", IEEE Transactions CAS, Volume CAS-21, No. 5, September 1974, pp. 649–655.

The disadvantages of these two filter types will be described hereinafter. Multiple-coupled cavity and narrow-band pass waveguide filters cannot be used at low or intermediate frequencies due to the rating and excessive overall dimensions. Conventional filters equipped with correcting networks require the use of special supply systems for active cells. In addition, they have large overall dimensions and are not always reliable.

BRIEF SUMMARY OF THE INVENTION

To obviate these disadvantages, the present invention proposes a self-corrected electric filter with localized constant elements comprising first input matching means for receiving the wide band input signal matching it and transmitting it to filtering means constituted by a group of filter elements in even numbers and in cascade for filtering the wide band signal and transmitting it to second output matching means, wherein it also comprises correction means constituted by secondary couplings placed between at least two filter elements in order to bring about a self-correction of the group delay time.

BRIEF DESCRIPTION OF THE DRAWINGS

The invention is described in greater detail hereinafter relative to non-limitative embodiments and with reference to the attached drawings, wherein show:

FIG. 1 the basic circuit of the self-corrected electric filter.

FIG. 4 a first connection method for a resonator.

FIG. 5 a second connection method for a resonator.

DETAILED DESCRIPTION OF THE PREFERRED EMBODIMENTS

Figure 2:
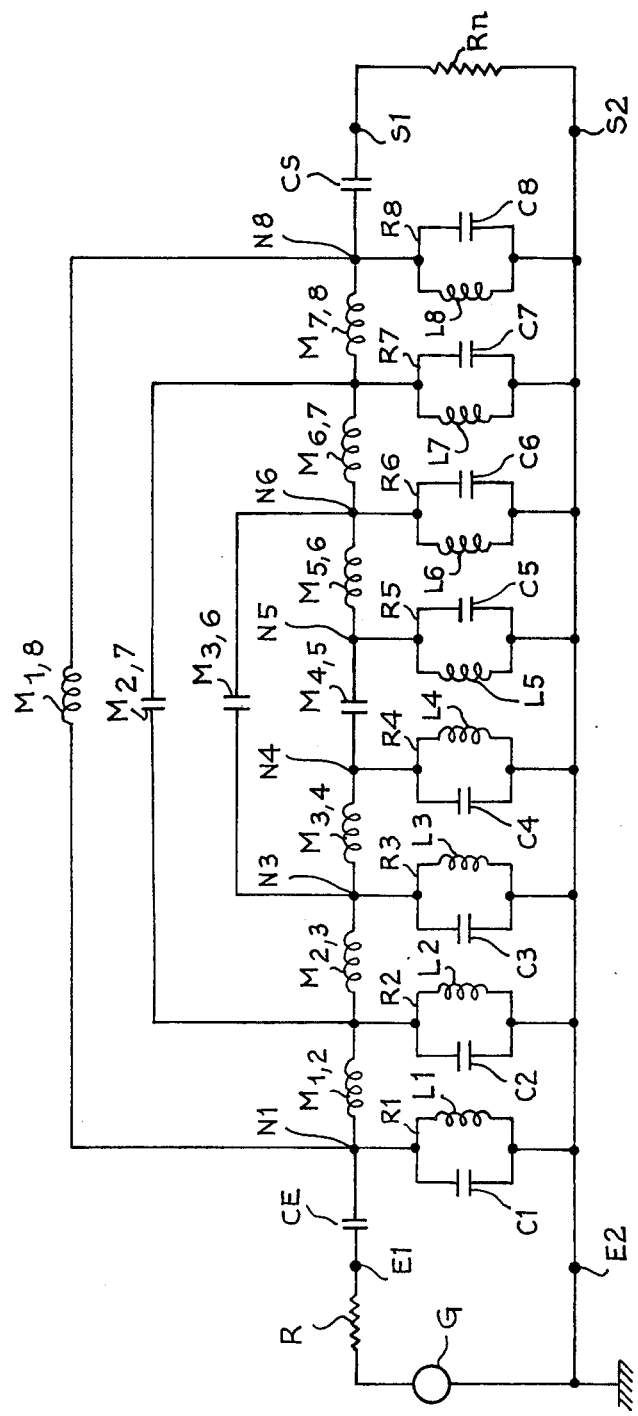
FIG. 2 a special construction of the filter according to the invention.

The self-corrected electric filter according to the invention, whose basic circuit is shown in FIG. 1, receives the input signal by means of a first pair of input terminals E1, E2, which form the filter input. An input impedance matching means 2.1 receives this signal, matches it and transmits it to the filtering means. The input impedance matching means 2.1 has two inputs and two outputs. The two outputs are connected to the inputs of the filtering means 3. The latter have two inputs and two outputs and are constituted by a number n of resonators, n being an even integer higher than 2. In the circuit diagram, n is limited to 8. Each resonator has a first and second input and a first and second output. The outputs of a first resonator are directly or indirectly connected to the inputs of a second resonator. This is called a cascade connection. The two outputs of the filtering means 3 are connected to an output impedance matching means 2.2. The two outputs of the matching means 3 are the two outputs of the final resonator. The two outputs of the output impedance matching means 2.2 are connected to second input terminals of filter S1 and S2. These two terminals constitute the outputs of the filter. The group delay self-correction means 4 are connected to the filtering means 3 by adjacent couplings 4.5. The adjacent couplings are constituted by localized constant elements $M_{i,j}$. Each resonator has an output connected to an input of the adjacent resonator via an adjacent coupling $M_{i,j}$. $M_{i,j}$ is such that $i = 1, 2, \ldots n-1$ $$j = i + 1$$

It represents the coupling between the ith resonator and the jth resonator, the jth being as follows. The self-correction means 4 also comprise non-adjacent couplings 4.6, constituted by localized constant elements $M_{k,l}$. These non-adjacent couplings are connected between the first output of the kth resonator and the first input of the ith resonator, whereby k can be equal to $1, 2 \ldots (n-2)/2$, 1 being equal to $n-(k-1)$. For $n=8$, the following couplings are obtained:

M1,8 between the first and 8th resonator
M2,7 between the 2nd and 7th resonator
M3,6 between the 3rd and 6th resonator.

FIGS. 4 and 5 show the diagram of the resonators. FIG. 4 shows a first method of connecting a non-adjacent coupling to a first output of a resonator. FIG. 5 shows a second method of connection, the two resonators shown in FIGS. 4 and 5 having an identical construction. They conventionally comprise a capacitor in parallel with an inductor (and optionally a resistor in parallel with the inductor or the capacitor for attenuating the resonator) having values such that it resonates at the tuning frequency. The resonators are provided with two outputs and two inputs.

In FIG. 4, the resonator has a first output and a first output subject to the same first potential. The second output and the second input are exposed to the same second potential. The adjacent coupling corresponding to this resonator is connected to the first output.

FIG. 5 differs in one point from FIG. 4. The first output is in this case at a centre point N of the inductor and the non-adjacent coupling is connected thereto.

FIG. 2 shows a special construction of the filter according to the invention. The filter is intended for a centre frequency in the intermediate frequency range about 70 MHz. The bandwidth at 3 dB is 17.5 MHz. Thus, the filter has a wide bandwidth in accordance with conventional criteria.

On referring to the basic circuit of FIG. 1 and with reference to the embodiment of FIG. 2, we obtain a filter having the characteristics according to the invention. The group delay time correction is physically expressed by an improvement in the transmission of the signal. This correction can also be observed from the shape of the delay curve shown in FIG. 3.

Thus, the following description refers to the circuit diagram of FIG. 1 and to the embodiment of FIG. 2. The filter is supplied by a receiver mixer represented in the drawing by a generator G supplying a signal of frequency 70 MHz and amplitude Vo. The internal impedance R of generator G is 75Ω. The signal supplied by the generator is applied to the input of the filter between input terminals E1 and E2. The second input E2 of the filter is at potential 0. The impedance matching means 2.1 and 2.2 are capacitors CE and CS. Capacitor CE is connected between input E1 and the first input of the first resonator R1. Capacitor CS is in series between output S1 and the final resonator R8. The two capacitors are equal to 24.96 pF in this embodiment, taking account of the signal generation means. The filtering means 3 are constituted by 8 resonators R1, R2 ... R8. Each resonator is identical to that shown in FIG. 4. The first input 1E and the first output 1S of the resonators are at the same potential. This same potential constitutes for each resonator a node N1, N2 ... N8. The second inputs and second outputs are at potential 0. Each resonator is connected to the following resonator by means of adjacent couplings, which are self-inductive, except between the two central resonators where the coupling is capacitive. The non-adjacent coupling M1,8 between the 1st and 8th resonators is self-inductive. The non-adjacent couplings M2,7 and M3,6 respectively between the 2nd and 7th resonators and between the 3rd and 6th resonators are capacitive. Naturally, each inductor can be replaced by an equivalent element, either a clearly defined inductor in series with an also clearly defined capacitor, or an inductor in parallel with a capacitor, or three inductors connected in T-like manner, i.e. a first inductor in series with a second inductor and a third inductor connected between the common point of the two first inductors and a given potential. The values of the adjacent or non-adjacent couplings are determined on the basis of the filter synthesis method. This method consists of finding the coupling matrix and the mismatch factors in order to obtain a required transfer function of the filter. It is known for narrow bandwidth. Therefore, the results obtained are not optimized. The calculations of the self-inductive and capacitive elements are carried out on the basis of the following equations:

$$\begin{cases} Lij = \dfrac{R \cdot Rn}{2\pi\, fo\, Mij} \\ Cij = \dfrac{Mij}{2\pi\, fo\, R \cdot Rn} \end{cases}$$

The self-inductive and capacitive elements of the resonators are calculated by means of the following equations:

$$\begin{cases} L = \dfrac{R \cdot Rn}{2\pi\, fo}\left(\dfrac{fp}{fo} - \dfrac{fo}{fp}\right) \\ C = \dfrac{1}{4\pi^2 fo^2 L} \end{cases}$$

fo being the centre frequency of the filter, fp the higher frequency of the final ripple, R being the internal resistance of the generator and Rn the resistance of the load. Mi,j being the term of order i,j of coupling matrix M.

A first group of results is obtained on the basis of these equations. Use is made of the optimization method of K. Madsen, H. Schiaer-Jacobsen and J. Voldby described in the article "Automated Minimax Design of networks", IEEE cir and Syst., Volume CAS-22, No. 10, October 1975, pp. 791-795. This optimization method makes it possible to reduce the deviations between the ideal response of the filter H(Fj) and the real response $F_O$(Fj) of a given frequency Fj. Two criteria are envisaged for measuring the quality of the real response and to guide the optimization in order to improve quality. Consideration is given either to the standard deviation of m functions H(Fj)

$$Eq = \sqrt{\dfrac{1}{m}\sum_{j=1}^{m}[H(Fj) - H_O(Fj)]^2}$$

or the maximum deviation of m functions H(Fj)

$$E_{max} = \max_j(H(Fj) - H_O(Fj)).$$

The optimization method takes account of the losses of each element. Thus, this method assumes that each element is not perfect because it has resistive characteristics at the resonant frequency. An inductor Lo is equivalent to an inductor L in series with a resistor R equal to L2 fo/Ql, in which Ql is the overvoltage factor of inductor L, R representing the losses. A capacitor Co is equivalent to a capacitor C in parallel with a resistor R equal to Qc/C2 fo in which Qc is the overvoltage coefficient of capacitor C. The optimization method is an iterative method. For each iteration, a non-linear problem to be solved is replaced by a linear approximation. When the required precision is reached, the iteration is stopped. The results are further optimized by adjusting the couplings obtained with the function of the frequency. An amplitude curve is obtained with minimum undulations. This curve also has an arithmetic symmetry with respect to the centre frequency Fo. In this way, an arithmetic symmetry of the group delay curve is also obtained.

For the present embodiment, the following results are obtained:

$M_{1,2} = M_{7,8} = 530.37$ nH $M_{2,3} = M_{6,7} = 799.49$ nH $M_{3,4} = M_{5,6} = 1055.63$ nH $M_{4,5} = 3.52$ pF $M_{3,6} = 1.63$ pF $M_{2,7} = 0$ $M_{1,8} = 10492.7$ nH $C_1 = C_8 = 26.11$ pF $C_2 = C_7 = 47.00$ pF $C_3 = C_6 = 41.53$ pF $C_4 = C_5 = 34.25$ pF $L_1 = 160$ nH $= L_2 = L_3 = L_4 = L_5 = L_6 = L_7 = L_8$.

Thus, in this special case, there is a symmetry of the values along a fictitious axis passing between the two central resonators R4 and R5.

Figure 3:
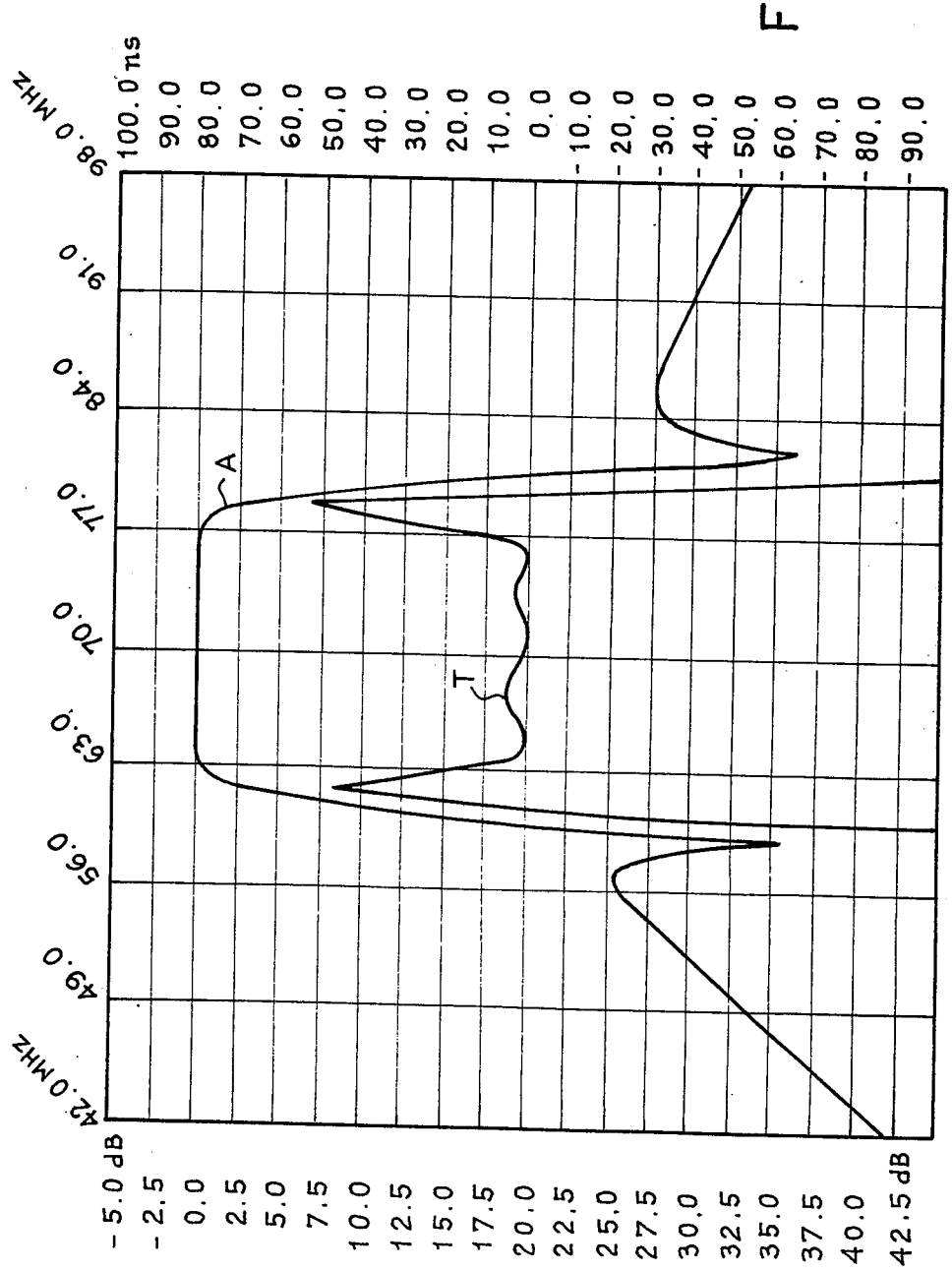
FIG. 3 the group delay and amplitude curves for a given frequency and given bandwidth.

The amplitude curve A of the filter is shown in FIG. 3. On the abscissa are plotted the values of the frequencies in MHz and on the ordinate the amplitude attenuation or gain in decibels. The arithmetic symmetry of the filter is expressed by a symmetry of the curve relative to the centre frequency. There is an arithmetic symmetry up to the 25 dB rejection band. This means that there is still a symmetry beyond the cut-off frequencies for an attenuation of 25 dB. This attenuation curve has steep slopes with substantially the same shape for the two cut-off frequencies, due to the arithmetic symmetry characteristics of the filter.

The group delay time curve T is also shown in FIG. 3. On the abscissa are plotted the frequencies in MHz and on the coordinate the time in nanoseconds. It can be seen that the group delay curve has the same characteristic as the attenuation curve, namely the arithmetic symmetry. It can also be seen that there is no delay variation between 63 and 77 MHz. The difference between 77 and 63 MHz represents roughly 80% of the useful band of the filter. Thus, there is a very good group delay variation correction in 80% of the useful band.

Figure 6:
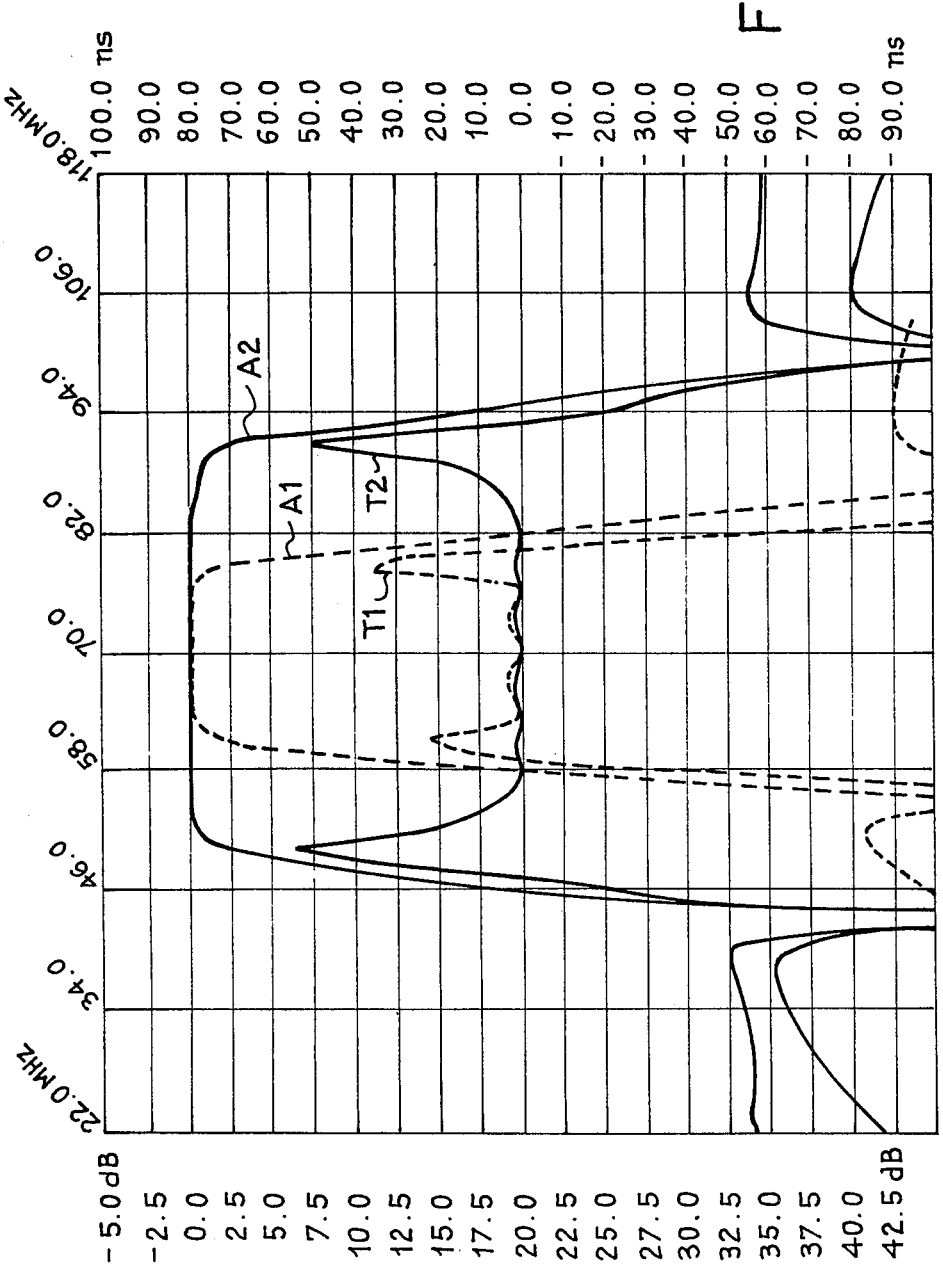
FIG. 6 the group delay and amplitude curves for second and third embodiments.

Two other constructions are made under the same supply and load conditions as in the first construction with bandwidth still wider than 17.5 MHz. One of these is a filter, whose centre frequency is roughly 70 MHz and whose bandwidth is substantially equal to 20 MHz. The amplitude curve A1 and group delay curve T1 are shown in FIG. 6. The other is a filter, whose centre frequency is at about 70 MHz and whose bandwidth is substantially equal to 36 MHz i.e. roughly 50% of the centre frequency value. The amplitude curve A2 and the group delay curve T2 are shown in FIG. 6. These two filters are diagrammatically shown in FIG. 2.

The results of the couplings obtained for the filter, whose bandwidth is substantially equal to 20 MHz are as follows:

$M_{1,2} = M_{7,8} = 550.8$ nH $M_{2,3} = M_{6,7} = 786.9$ nH $M_{3,4} = M_{5,6} = 1073.2$ nH $M_{4,5} = 2.8$ pF $M_{3,6} = 1.9$ pF $M_{2,7} = 0.5$ pF $M_{1,8} = 22723$ nH $C_1 = C_8 = 23.9$ pF $C_2 = C_7 = 43.4$ pF $C_3 = C_6 = 38.5$ pF $C_4 = C_5 = 31.9$ pF $L_1 = L_2 = L_3$ ----- $= L_8 = 175$ nH

The results of the couplings obtained for the filter, whose bandwidth is substantially equal to 36 MHz are as follows:

$M_{1,2} = M_{7,8} = 171.2$ nH $M_{2,3} = M_{6,7} = 223.7$ nH $M_{3,4} = M_{5,6} = 305.7$ nH $M_{4,5} = 12.2$ pF $M_{3,6} = 6.9$ pF $M_{2,7} = 0.5$ pF $M_{1,8} = 5959$ nH $C_1 = C_8 = 56.0$ pF $C_2 = C_7 = 76.5$ pF $C_3 = C_6 = 60.5$ pF $C_4 = C_5 = 42.3$ pF $L_1 = L_2 = L_3$ ----- $= L_8 = 160$ nH.

The results obtained for these two other constructions corresponding to wider bandwidth make it possible to obtain an attenuation curve A1, A2 having an arithmetic symmetry up to the 25 dB rejection band and a group delay curve T1, T2 also having an arithmetic symmetry and a very good group delay time correction in 80% of the useful band.

The three constructions described underwent a temperature variation test. The tests were performed between a minimum temperature equal to −30° C. and a maximum temperature equal to +70° C. After these tests, the group delay and amplitude curves underwent negligible variations and remained very close to the ideal response of the filter.

The results obtained are identical to those obtained by using filters with correction networks, but the overall dimensions are reduced by 50% and in addition, no lack of stability due to the temperature occurred due to the absence of the active element.

What is claimed is:

1. A self-corrected electric filter with localized constant elements for filtering a wide band input signal which comprises:

filtering means constituted by a group of n resonators R1 to Rn, n being an even number, n−2 resonators of the group being ordered in cascade between the first resonator R1 and the final resonator Rn;

input impedance matching means connected to said first resonator R1 for applying said wide band input signal to said filtering means;

output impedance matching means connected to said final resonator Rn for constituting the output of said self corrected electric filter;

correction means comprising a first group of coupling means Mi,i+1, whereby i is a positive integer and takes all the possible values from 1 to n−1, each coupling means Mi,i+1 connecting two adjacent resonators Ri and Ri+1, said group of n resonators being self inductive except for the coupling means connecting the two central resonators which is capacitive, said correction means also comprising a second group of secondary coupling means MK,1, each secondary coupling means connecting a Kth and a lth resonator RK and Rl of said group of n resonators, whereby K takes all possible values from 1 to (n−2)/2 individually, and l is equal to n−(K−1), for contributing to arithmetic symmetry of the amplitude and of the group delay time for correcting distortion of group delay time.

2. A filter according to claim 1, wherein said input matching means includes first input, a second input, and a first matching capacitor, whereof a first terminal is connected to the first input, and said filtering means includes eight resonators in cascade, whereof said first resonator is connected to the second input and to a second terminal of the first capacitor thus forming a first node, each resonator being constituted by a capacitor in parallel with an inductor, and said correction means includes a first inductor connected between the first and second resonators, a second inductor connected between the second and third resonators, a third inductor connected between the third and fourth resonators, a fifth inductor connected between the fifth and sixth resonators and being equal to the first resonator, a sixth inductor connected between the sixth and seventh resonators and being equal to the second resonator, a seventh conductor connected between the seventh and eighth resonators and being equal to the third resonator, a capacitor connected between the fourth and fifth resonators, and wherein said secondary coupling means includes an inductor connected between the first and eighth resonators and a capacitor connected between the third and sixth resonators.

3. A filter as in claim 1 wherein for n=8, coupling means M12, M23, M34, M56, M67, M78 and M36 are self inductive elements and are adjusted to obtain a same inductance value respectively for the coupling means M12 and M78, the coupling means M23 and M67, and the coupling means M34 and M56 and wherein the coupling means M45, M27 and M36 are capacitors.

* * * * *